(12) United States Patent
Ju

(10) Patent No.: US 7,099,213 B2
(45) Date of Patent: Aug. 29, 2006

(54) PAGE BUFFER FOR FLASH MEMORY DEVICE

(75) Inventor: Gi Seok Ju, Ichon-Shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 11/007,182

(22) Filed: Dec. 9, 2004

(65) Prior Publication Data

US 2005/0152188 A1 Jul. 14, 2005

(30) Foreign Application Priority Data

Jan. 9, 2004 (KR) ........................ 10-2004-0001648

(51) Int. Cl.
*G11C 7/00* (2006.01)
(52) U.S. Cl. ............ 365/203; 365/185.17; 365/185.22; 365/189.05
(58) Field of Classification Search .................. None
See application file for complete search history.

(56) References Cited

U.S. PATENT DOCUMENTS

| | | | | | |
|---|---|---|---|---|---|
| 5,835,414 A | * | 11/1998 | Hung et al. | ............ | 365/185.25 |
| 5,982,663 A | * | 11/1999 | Park | ...................... | 365/185.09 |
| 6,067,248 A | * | 5/2000 | Yoo | ...................... | 365/185.03 |
| 6,768,682 B1 | * | 7/2004 | Yano et al. | ............ | 365/185.28 |
| 6,813,187 B1 | * | 11/2004 | Lee | ........................ | 365/185.18 |
| 6,826,082 B1 | * | 11/2004 | Hwang et al. | .......... | 365/185.17 |
| 6,937,510 B1 | * | 8/2005 | Hosono et al. | ........ | 365/185.03 |

* cited by examiner

*Primary Examiner*—Amir Zarabian
*Assistant Examiner*—Kretelia Graham
(74) *Attorney, Agent, or Firm*—Mayer, Brown, Rowe and Maw LLP

(57) ABSTRACT

The disclosed is a page buffer of a flash memory device. In accordance with the present invention, a latch is controlled through a program verification signal, a latch signal, and latch data in a page buffer during a program verification. As a result, there are many advantages. First, in the event that the program verification is performed after programming once more, a passed cell is not sensed again and maintains its value. Second, it is possible to prevent a problem caused by a sensing operation as well as a verification error due to an external factor. As a result, program operation errors can be prevented.

5 Claims, 2 Drawing Sheets

PAGE BUFFER FOR FLASH MEMORY DEVICE

BACKGROUND

1. Field of the Invention

The present invention is directed to a page buffer of a flash memory device and more particularly, a page buffer circuit capable of reducing a program error.

2. Discussion of Related Art

In general, program verifications whether data is exactly programmed or not are performed after programming data in NAND-type flash memory devices. If data is not programmed, it is programmed once more. To the contrary, if data is programmed, next operation is performed.

In this progress, if a passed cell at first is influenced by an external factor, or if the program verification is performed without a margin of threshold voltage, a previous passed cell would be failed. Thus, a cell with increased threshold voltage is programmed again, and thereby more increasing the threshold voltage of a cell so that a program error may occur.

SUMMARY OF THE INVENTION

It is therefore an object of the present invention to provide a flash memory device capable of solving a problem in a program operation by fixing a latch data value of a cell passed once in a program verification operation and maintaining the latch data value in a subsequent program verification operation.

One aspect of the present invention is to provide a page buffer of a flash memory device in which comprises a precharge node; a first PMOS transistor for precharging the precharge node according to a precharge enable signal; a latch unit for latching a logic state and a hold signal of the precharge node; and a latch control unit for outputting the hold signal according to a data signal latched into the latch unit, a program verification signal, and a latch enable signal.

In addition, a page buffer of a flash memory device includes a precharge node, a page buffer unit for sensing predetermined data according to a state of the precharge node, a bit line selection unit for transferring a logic state of a bit line and the precharge node according to a bit line selection signal to the precharge node and the bit line. In this case, the page buffer for the flash memory device performs several programs and program verification operations. Furthermore, the page buffer for the flash memory device further includes a latch control unit for outputting a hold signal controlling the latched operation in the page buffer that is verified to a previously programmed cell in next program using a latch signal in a page buffer unit in which a verification result of the programmed cell is latched in a previous verification program.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Hereinafter, it will be described about an exemplary embodiment of the present invention in conjunction with the accompanying drawings.

Figure 1:
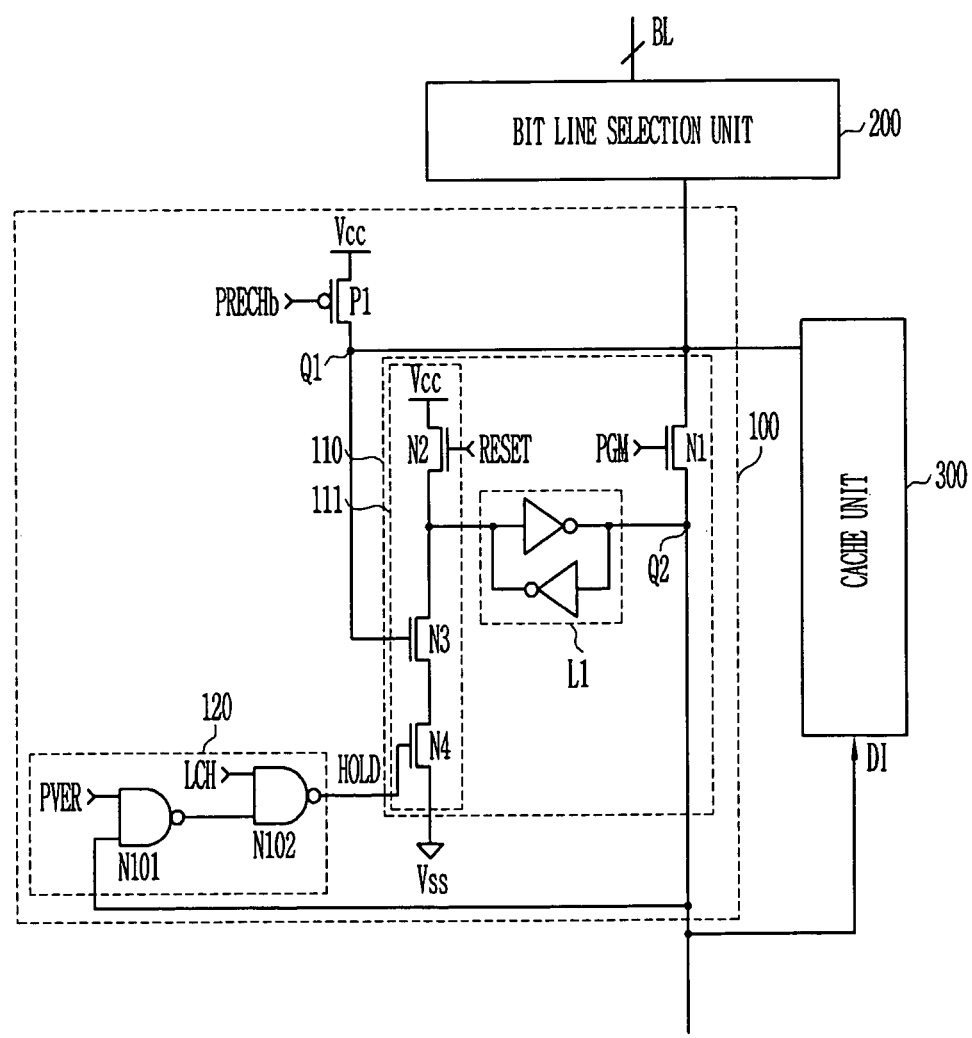
FIG. 1 is a circuit diagram illustrating a page buffer of a flash memory device according to the present invention.

FIG. 1 shows a page buffer of a flash memory device of the present invention.

Referring to FIG. 1, the flash memory device according to the present invention includes a page buffer 100, a bit line selection unit 200, and a cache unit 300. The page buffer 100 senses and latches data of a flash memory cell. The bit line selection unit 200 transfers information of the page buffer 100 or the cell to a selected bit line BL. The cache unit 300 caches predetermined data and then transfers the data to the page buffer 100.

In order to sense or latch data of a predetermined cell, in a programming operation, external data Dl is stored in the cache unit 300, and then predetermined data is transferred to the page buffer 100. Then, the contents of the page buffer 100 are applied through the bit line selection unit 200 to a bit line. In the meanwhile, in a reading operation, the bit line BL is precharged by the page buffer 100 so as to read data stored in the cell. After that, a cell state is stored at a latch in the page buffer 100 by sensing a state of the bit line BL that is precharged as a predetermined time passed.

Now, the page buffer of the present invention will be more fully described hereinafter.

The page buffer 100 includes a precharge node Q1, a first PMOS transistor P1 for precharging the precharge node Q1 according to a precharge enable signal PRECHb, a latch unit 110 for latching predetermined data according to a logic state of the precharge node Q1 and a hold signal HOLD, and a latch control unit 120 for outputting the hold signal HOLD according to a program verification signal PVER and a latch enable signal LCH.

The latch unit 110 includes a first latch L1, a first NMOS transistor N1, and a control unit 111. One input terminal of the first latch L1 is connected to a latch node Q2. The first latch L1 senses and latches predetermined data. The first NMOS transistor N1 is connected between the latch node Q2 and the precharge node Q1 to connect the precharge node Q1 and the first latch L1 according to a data transmission signal PGM. The control unit 111 controls an operation the first latch L1 according to the precharge node Q1, the hold signal HOLD, and a reset signal RESET. The control unit 111 includes a second NMOS transistor N2, and third and fourth NMOS transistors N3 and N4. The second NMOS transistor N2 is connected to a power voltage Vcc and another input terminal of the first latch L1 to be driven according to the reset signal RESET. The third and fourth NMOS transistors N3 and N4 are connected serially between another input terminal of the first latch L1 and a ground power Vss to be respectively driven according to the precharge node Q1 and the hold signal HOLD.

The latch control unit 120 includes a first NAND gate N101 and a second NAND gate N102. The first NAND gate N1O1 receives a logic state of the program verification node PVER and the latch node L1. The second NAND gate N102 receives the output of the first NAND gate N101 and the latch enable signal LCH again to output the hold signal HOLD. If the program verification signal is logically low, the logic state of the hold signal HOLD is changed depending on the latch enable signal LCH. If the program verification signal is logically high, the logic state of the hold signal HOLD is changed according to a logic state of the first latch L1 that is sensed at once.

An operation of the page buffer circuit of the present invention with the above-mentioned construction will be described on the basis of a program verification operation.

If the program enable signal PRECHb is applied, a signal stored in the cache unit 300 is latched into the first latch L1. By the first NMOS transistor N1 through applying the data transmission signal PGM, data stored in the first latch L1 is applied to the precharge node Q1, and data of the precharge node Q1 is applied through the bit line selection unit 200 to the bit line BL. Data of a predetermined cell is programmed by performing a program operation. Preferably, a voltage of 0V is applied to the bit line, voltage of 15 through 20V are applied to a word line of a selected cell, and voltages of 9 through 11V are applied to a non-selected word line.

After programming as stated above, a program enable signal becomes logically low. Then, the program verification signal PVER becomes logically high for the program verification, and thereby performing the program verification operation. It is effective to perform the program verification through a read operation.

For the program verification, in advance, a first PMOS transistor is driven according to the precharge enable signal PRECHb to apply a precharge voltage to the precharge node Q1. A program state of the selected cell is estimated by applying the precharge voltage through the bit line selection unit 200 to the bit line BL where the selected cell exits.

As the estimation result, a voltage of the bit line BL charged to the precharge voltage depending on the program state is dropped or maintained constantly. In other words, if the cell is programmed satisfactorily, the voltage of the bit line BL still maintains the precharge voltage that is applied at first. However, if the cell is not programmed, the voltage of the bit line BL is dropped. The reason for this is that the threshold voltage of the cell is changed according to the program state, and hereby, there may be a current passing between the bit line and a source line.

If the cell is programmed satisfactorily, a voltage of the precharge node Q1 is B3. A logic high program verification signal PVER and a logic high signal of the latch node Q2 are applied to the first NAND gate N101 so that a logic low signal is outputted. The first NAND gate signal N1O1 with logic high and the second NAND gate N102 receiving the latch enable signal LCH apply a logic-high hold signal HOLD to the fourth NMOS transistor N4 by the first NAND gate signal N1O1 of logic low. Through these processes, the first latch L1 is set to "1" so that a value of the latch node Q2 is always set to logic high. As a result, these processes notice that the cell is programmed by the program verification operation.

To the contrary, if the cell is not programmed, the voitage of the precharge node Q1 According to a logic low signal of the latch node Q2, the first NAND gate N101 outputs a logic high signal. At this time, the second NAND gate N102 changes a logic state of the hold signal HOLD according to a logic state of the latch enable signal LCH rather than an output of the first NAND gate N101. These processes notice that the cell is not programmed by the program verification operation.

The above-mentioned page buffer is more effective in several program operations and the program verification operation. That is, a page buffer that is logically high (a cell is programmed satisfactorily) to a latch end by performing a first program and then verifying the first program is not programmed in a second program operation. In addition, the latch control unit applies a logic high hold signal according to the logic high signal of the latch end to compulsorily control the first latch. As a result, it is possible to prevent a data variation latched into the first latch by an external factor or an error of a threshold voltage in the program verification.

Figure 2:
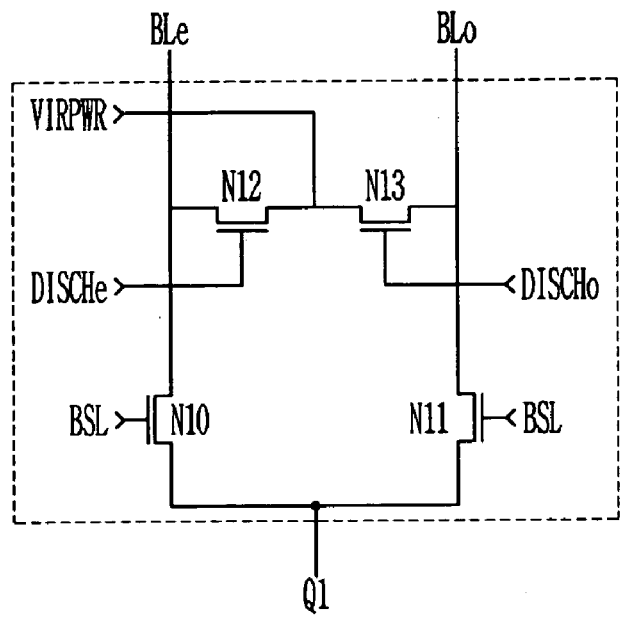
FIG. 2 is a circuit diagram of a bit line selection unit according to the present invention.

FIG. 2 is a circuit diagram of the bit line selection unit of the present invention.

Referring to FIG. 2, the bit line selection unit includes tenth NMOS transistor, N10 the eleventh NMOS transistor N11, the twelfth NMOS transistor N12, and thirteenth NMOS transistor N13. The tenth NMOS transistor N10 is connected to the precharge node Q1 of the page buffer 100 and an even bit line BLe to be driven according to a bit line selection signal BSL. The eleventh NMOS transistor N11 is connected to the precharge node Q1 of the page buffer 100 and an odd bit line BLo to be driven according to the bit line selection signal BSL. The twelfth NMOS transistor N12 is connected between an external virtual power input terminal VIRPWR and the even bit line BLe to be driven according to a reset signal DISCHe of the even bit line BLe. The thirteenth NMOS transistor N13 is connected between the external power input terminal VIRPWR and the odd bit line BLo to be driven according to the a reset signal DISCH of the odd bit line BLo.

In the bit line selection unit 200 with the above-mentioned construction, the tenth and eleventh NMOS transistor N10 and N11 are selected according to the bit line selection signal BSL so that data in the page buffer 100 is applied to the bit line (BLe or BLo), or data of the cell is applied through the selected bit line to the page buffer 100. Additionally, a virtual power for resetting the bit line BL is applied according to the bit line reset signal DISCH. In a read operation, the bit line BL is reset by applying a ground power to the virtual power. In a program operation, the bit line BL is rest by applying a power voltage to the virtual power.

Figure 3:
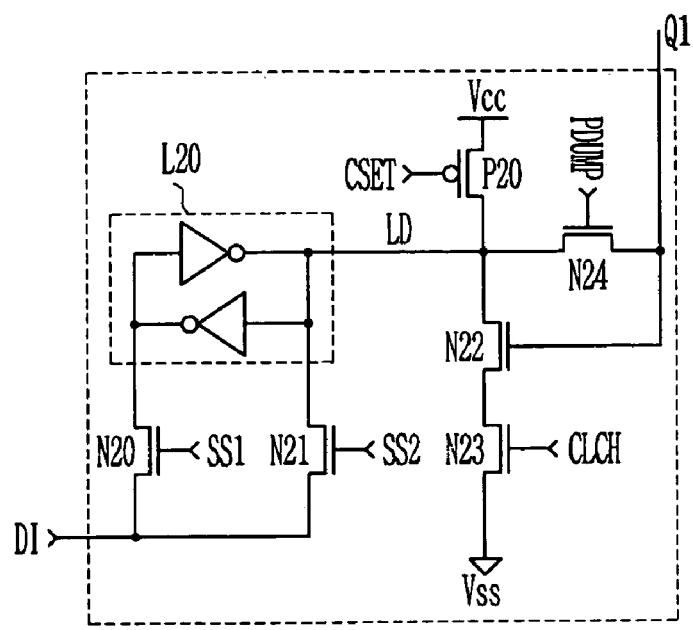
FIG. 3 is a circuit diagram of a cache unit of the present invention.

FIG. 3 is a circuit diagram of the cache unit of the present invention. Referring to FIG. 3, the cache unit includes a 20th latch L20, a 20th NMOS transistor N20, a 21st NMOS transistor N21, a 20th PMOS transistor P20, 22nd and 23rd NMOS transistors N22 and N23, and a 24th NMOS transistor N24. The 20th latch L20 latches predetermined data. The 20th NMOS transistor N20 is connected between a first input terminal of the 20th latch L20 and an external data Dl input terminal to be driven according to a first selection signal SS1. The 21st NMOS transistor is connected between a second input terminal of the 20th latch L20 and the external data Dl input terminal to be driven according to a second selection signal SS2.

The 20th NMOS transistor N20 is connected between a first input terminal of the 20th latch L20 and an external data Dl input terminal to be driven according to a first selection signal SS1. The 21st NMOS transistor is connected between a second input terminal of the 20th latch L20 and the external data Dl input terminal to be driven according to a second selection signal SS2. The 20th PMOS transistor P20 is connected between the second input terminal of the 20th latch L20 and power voltage Vcc to be driven according to a cache reset signal CSET. The 22nd and third NMOS transistors N22 and N23 are connected between the second input terminal of the second latch L20 and the ground voltage Vss serially to be driven according to an output terminal signal of each cache unit 300 and a cache latch control signal CLCH. The 24th NMOS transistor N24 is connected between the second input terminal of the 20th latch L20 and the output terminal of the cache unit 300 to be driven according to an external dump signal PDUMP.

Now, an operation of the cache unit will be described hereinafter. The cache unit 300 is located at the side of the page buffer 100 so as to increase a speed of an input/output operation of the page buffer 100. By external data Dl, and first and second selection signals SS1 and SS2, one of the 20th and 21st NMOS transistors N20 and N21 is turned on so that predetermined data is latched into the 20th latch L20. It is preferable that this process is performed between clocks generated in a programming/erasing operation. At this time, after resetting the precharge node Q1 of the page buffer unit 100, data latched by the 20th latch L20 is applied to the precharge node Q1 by applying the dump signal PDUMP. A latched data LD may be outputted in an inverse order of the above process or may be directly outputted through the page buffer 100.

Now, the page buffer of the present invention related with a program operation and a program verification operation will be described.

In accordance with the present invention, it is possible to prevent a program error by having a latch control unit. The reason for this is that the latch control unit maintains a latch signal of a program verified page buffer in a page buffer of a flash memory device for performing several program operations and program verification operations.

In order to this, the page buffer of the flash memory device in which comprises a precharge node, a page buffer unit including a latch for latching or sensing predetermined data according to a state of the precharge node, a bit line selection unit for transferring a logic state of a bit line and the precharge node according to a bit line selection signal to the precharge node and the bit line. In this case, the page buffer unit for the flash memory device performs several programs and program verification operations. In addition, the page buffer for the flash memory device further includes a latch control circuit for outputting a hold signal controlling the latch operation in the page buffer unit during a program verification operation, with the hold signal being generated in response to a data signal latched in the latch.

The latch control unit includes a program verification signal, a first NAND gate, and a second NAND gate. The first NAND gate receives a logic state of a data signal latched to a latch. The second NAND gate receives an output signal of the first NAND gate and a latch enable signal to output the hold signal.

Data of predetermined cell is programmed by a first program operation. Whether data of the cell is programmed or not is determined by detecting a threshold voltage that is programmed to the predetermined cell by a first program verification operation. Preferably, predetermined cell stored in a latch is applied through a precharge node to a bit line by a program operation, and the program operation is performed by applying a predetermined operation between word and source lines of a cell. A program verification operation is performed as followings. After resetting a latch, a precharge voltage is applied to a precharge node. Then, a cell is estimated by applying the precharge voltage through a bit line selection unit to a bit line. At this time, if the precharge voltage applied to the bit line is not changed, a logic high value is stored in the latch. As a result, it is noticed that the cell is programmed normally. In the case that the precharge voltage is dropped, a logic low value is stored in the latch so that the program operation of the cell is failed. Thus, the program operation is performed again.

As stated above, if the program operation of the cell is failed, the program verification operation and the program operation are performed again. By a second program operation, the program operation with respect to the failed cell is performed once more. In addition, the programmed cell is verified once more by performing a second program verification operation. At this time, a page buffer latch that is already latched to a logic high value in the second program verification operation maintains its value even though the second program verification operation is performed by the latch control unit.

As previously mentioned, a latch in a page buffer is controlled by a program verification signal in a program verification and latch data the page buffer. Thus, if the program verification is performed once more after programming, a passed cell is not sensed again and maintains its value.

In addition, it is possible to prevent a problem caused by a sensing operation as well as a verification error due to an external factor.

Furthermore, program operation errors can be prevented.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A page buffer for a flash memory device comprising:
a precharge node;
a first PMOS transistor precharging the precharge node according to a precharge enable signal;
a latch unit latching predetermined data according to a logic state and a hold signal of the precharge node; and
a latch control unit outputting the hold signal according to a data signal latched into the latch unit, a program verification signal, and a latch enable signal.

2. The page buffer for the flash memory device of claim 1, wherein the latch unit comprises:
a latch node;
a first latch having one input terminal connected to the latch node, for sensing and latching predetermined data;
a first NMOS transistor connected between the latch node and the precharge node to connect the precharge node and the first latch according to a data transmission signal;
a second NMOS transistor connected between a power voltage and another input terminal to be driven according to a reset signal; and
third and fourth NMOS transistors connected between another input terminal and a ground power to be driven according to a state signal of the precharge node and the hold signal.

3. The page buffer for the flash memory device of claim 2, wherein the latch control unit comprises:
a first NAND gate receiving the program verification signal and a logic state of the data signal stored into the latch unit; and
a second NAND gate receiving an output signal of the first NAND gate and the latch enable signal to output the hold signal.

4. A page buffer for a flash memory device including a precharge node, a page buffer unit including a latch for latching or sensing predetermined data according to a state of the precharge node, a bit line selection unit for transferring a logic state of a bit line and the precharge node according to a bit line selection signal to the precharge node and the bit line, wherein the page buffer unit for the flash memory device performs several programs and program verification operations, and further includes a latch control unit for outputting a hold signal controlling a latch operation in the page buffer unit during a program verification operation, with the hold signal being generated in response to a data signal latched in the latch.

5. The page buffer of claim 4, wherein the latch control unit includes:

a first NAND gate receiving the logic state of a program verification signal and the data signal latched to the latch; and a second NAND gate receiving an output signal of the first NAND gate and a latch enable signal to output the hold signal.

* * * * *